(12) United States Patent
Li

(10) Patent No.: US 10,916,717 B2
(45) Date of Patent: Feb. 9, 2021

(54) FLEXIBLE ORGANIC LIGHT EMITTING DIODE DISPLAY ASSEMBLY

(71) Applicant: WUHAN CHINA STAR OPTOELECTRONICS SEMICONDUCTOR DISPLAY TECHNOLOGY CO., LTD., Hubei (CN)

(72) Inventor: Yun Li, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 101 days.

(21) Appl. No.: 16/093,977

(22) PCT Filed: Aug. 23, 2018

(86) PCT No.: PCT/CN2018/101873
§ 371 (c)(1),
(2) Date: Oct. 16, 2018

(87) PCT Pub. No.: WO2019/227701
PCT Pub. Date: Dec. 5, 2019

(65) Prior Publication Data
US 2019/0372033 A1    Dec. 5, 2019

(51) Int. Cl.
*G06F 1/16* (2006.01)
*H01L 51/00* (2006.01)
*H01L 27/32* (2006.01)

(52) U.S. Cl.
CPC ........ *H01L 51/0097* (2013.01); *G06F 1/1616* (2013.01); *G06F 1/1641* (2013.01);
(Continued)

(58) Field of Classification Search
CPC ... H01L 27/3244–3279; H01L 51/0097; H01L 2251/5338; G06F 1/1616;
(Continued)

(56) References Cited

U.S. PATENT DOCUMENTS 9,348,450 B1    5/2016 Kim
2011/0285607 A1*  11/2011 Kim .................. G06F 3/041
                                                    345/1.3
(Continued)

FOREIGN PATENT DOCUMENTS

CN    106205385 A    12/2016
CN    107067976 A     8/2017

*Primary Examiner* — Yu Chen
(74) *Attorney, Agent, or Firm* — Mark M. Friedman

(57) ABSTRACT

A flexible organic light emitting diode display assembly is provided and includes an OLED panel, a first substrate, and a second substrate, wherein a first support extends outwardly from one end of the first substrate, a second support extends outwardly from one end of the second substrate, the first support and the second support are arranged to abut against each other, the OLED panel is disposed on the first substrate, the first support, the second support, and the second substrate. A flexible connecting member is positioned under the first support and the second support. When the OLED panel is bent such that the second substrate covers the first substrate, the flexible connecting member being stretchable from an original normal state to an extended state.

8 Claims, 1 Drawing Sheet

(52) U.S. Cl.
CPC .......... *G06F 1/1652* (2013.01); *G06F 1/1679* (2013.01); *G06F 1/1681* (2013.01); *H01L 27/3244* (2013.01); *H01L 27/3253* (2013.01)

(58) Field of Classification Search
CPC .... G06F 1/1618; G06F 1/1652; G06F 1/1679; G06F 1/1681; G06F 1/1641; G09F 9/301
See application file for complete search history.

(56) References Cited

U.S. PATENT DOCUMENTS

| | | |
|---|---|---|
| 2016/0302316 A1 | 10/2016 | Jeong et al. |
| 2018/0095502 A1* | 4/2018 | Yamazaki .............. F16M 13/00 |
| 2018/0108851 A1* | 4/2018 | Cheng ................. H01L 51/0097 |
| 2018/0196469 A1* | 7/2018 | Yamauchi ............. G06F 1/1616 |
| 2019/0082544 A1 | 3/2019 | Park |
| 2019/0334114 A1* | 10/2019 | Park ...................... G06F 1/1652 |

* cited by examiner

FLEXIBLE ORGANIC LIGHT EMITTING DIODE DISPLAY ASSEMBLY

FIELD OF INVENTION

The invention relates to a display assembly and, in particular, to a flexible OLED display assembly

BACKGROUND OF INVENTION

It is known that as science and technology are constantly improving, imaging display technologies have also accordingly seen great progress. Starting from original cathode ray tube (CRT) displays, display technologies began to develop at an enormous rate on not only size and weight of display devices, but also display principles, which are greatly different. Currently, CRT displays liquid have been gradually replaced by crystal displays (LCDs).

Furthermore, each display device of the LCD displays is usually formed by attaching a thin film transistor array substrate (TFT array substrate) and a color filter (CF) substrate and filling liquid crystals between the TFT substrate and the CF substrate. Directional changes of the liquid crystal molecules are controlled by application of electricity in order to reflect light which is emitted from backlight modules and generate images.

Although LCD displays have advantages of being light weight, good display, and the like, there are still some defects. For example, the LCD displays cannot be folded. Therefore, foldable organic light emitting diode (OLED) display devices are being developed by the industry.

Furthermore, because OLED display panels possess many outstanding properties such as self-luminous, low driving voltage, high electroluminescent efficiency, short response times, high resolution and contrast, near 180 degree viewing angle, wide range of working temperatures, amenability to flexible displays, large scale full-color display, and the like, the OLEDs are considered to be display panels having greatest potential for development.

For a display panel of the flexible OLED, dynamic bending of the display panel mainly depends on a plate to support and implement bending. Therefore, when considering the implement of a design scheme for the dynamic bending structure of the flexible OLED display panel, not only possession of fine repeatability of bending is considered, but also the capability of avoiding a disposition of a display area of the OLED panel at the bending area in order to prevent the flexible OLED display assembly from being damaged by the bending stress.

Therefore, it is necessary to develop a novel flexible OLED display assembly to overcome the defects in the prior art.

SUMMARY OF INVENTION

The invention aims to provide a flexible OLED display assembly. The movably foldable structure thereof possesses a fine repeatability of bending and is capable of avoiding a disposition of a display area of the OLED panel at the bending area, thereby preventing the flexible OLED display assembly from being damaged by the bending stress.

In order to achieve the foregoing purposes, technical schemes provided by the disclosure are as follows:

A flexible organic light emitting diode (OLED) display assembly, comprising an OLED panel, wherein the OLED panel has a first folding area, a folding line is defined in the first folding area, and the first folding area is foldable along the folding line, wherein a first substrate and a second substrate are disposed under the OLED panel, wherein the first substrate is disposed along a first side of the folding line of the first folding area and the second substrate is disposed along a second side of the folding line of the first folding area; wherein a first support extends outwardly from one end of the first substrate, a second support extends outwardly from one end of the second substrate, an abutting side portion of the first support and an abutting side portion of the second support are arranged to abut against each other and the OLED panel is disposed on the first substrate, the first support, the second support, and the second substrate; wherein a flexible connecting member is positioned under the first support and the second support, both ends of the flexible connecting member are respectively connected to the first substrate and the second substrate, and a length of the flexible connecting member is equal to a sum of a length of the first substrate and a length of the second substrate in an original normal stage of the flexible connecting member; and wherein when the first folding area of the OLED panel is folded along the folding line of the first folding area such that the second substrate covers the first substrate, the flexible connecting member being stretchable from the original normal state to an extended state.

In different embodiments, the amount of the folding areas which are disposed on the OLED panel may be a plurality. For example, a first folding area, a second folding area, a third folding area, etc. Each folding area can be bent along a preset folding line. The concrete arrangement amount of the folding zones are disposed as needed, which are not limited. In addition, two supporting back plates are disposed in the bottom of each folding area which are disposed along the two sides of the folding line.

Furthermore, in different embodiments, wherein upper corners of abutting end portions of the first support and the second support each is arc-shaped such that a notch is defined between a supporting surface of the first support and a supporting surface of the second support where the end portions of the first support and the second support are arranged to abut against each other.

Furthermore, in different embodiments, wherein upper corners of abutting end portions of the first support and the second support each is arc-shaped such that a notch is defined between the first support and the second support where the end portions of the first support and the second support are arranged to abut against each other.

Furthermore, in different embodiments, wherein the abutting side portion of the first support and the abutting side portion of the second support are shaped as gapless complementary shapes to each other, wherein the gapless complementary shapes each can be various known complementary shapes and engaging shapes, such as, but are not limited to, a rectilinear shape, a curve shape, a sawtooth shape, and a concave-convex shape. In addition, the above-mentioned gapless complementary shapes can be used in a combination, for example, a section having a curve complementary shape and a section having a sawtooth complementary shape, etc. The concrete arrangements are disposed as needed, which are not limited.

For the abutting side portion of the first support and the abutting side portion of the second support, non-rectilinear complementary shapes are employed, for example, a curve shape, a sawtooth shape, and a concave-convex shape, etc., which also effectively prevent the displacement between both the abutting side portion of the first support and the abutting side portion of the second support and facilitate the stability of mutual positioning of both the abutting side portion of the first support and the abutting side portion of the second support.

Furthermore, in different embodiments, wherein the flexible connecting member comprises an elastic linkage consisting of an elastic material and the flexible connecting member is stretchable and extendable when a force is applied to the flexible connecting member, wherein the elastic material can be various suitable elastic materials or springs known in the industry. The concrete selection can be determined by combining a length of the first support and a length of the second support and by concrete experiments.

Furthermore, in different embodiments, wherein the flexible connecting member comprises a chain-shaped stretchable structure, the chain-shaped stretchable structure is stretchable and extendable when a force is applied to the chain-shaped stretchable structure, and the chain-shaped stretchable structure is retractable and returned to the original normal state by a force when the chain-shaped stretchable structure is at the extended state.

Furthermore, in different embodiments, wherein a space is defined between the flexible connecting member, the first support, and the second support. The arrangement of the space can prevent the present of possible accidental interference when bending the OLED panel between the flexible connecting member and the support.

In other different embodiments, wherein the flexible connecting member can be attached to the bottom of the first support and the second support, as long as the first support and the second support do not interfere with each other when the OLED panel is bent. The concrete arrangements can be disposed as needed, which are not limited.

Furthermore, in different embodiments, wherein a support plate is disposed in the space and the support plate is attached to the bottom of the first support and/or the second support to support the first support and the second support. The connection mode between the support plate and the bottom of the support can be various connection modes known in the industry, for example, but is not limited to, screw connection.

Furthermore, in different embodiments, wherein the support plate comprises a first support plate and a second support plate, the first support plate and the second support plate are disposed in a bottom of the first support and a bottom of the second support respectively, an abutting side portion of the first support plate and an abutting side portion of the second support plate are arranged to abut against each other, and the abutting side portion of the first support plate and the abutting side portion of the second support plate are shaped as gapless complementary shapes to each other, wherein the gapless complementary shapes each can be various known complementary shapes and engaging shapes, such as, but are not limited to, a rectilinear shape, a curve shape, a sawtooth shape, and a concave-convex shape. In addition, the above-mentioned gapless complementary shapes can be used in a combination, for example, a section having a curve complementary shape and a section having a sawtooth complementary shape, etc. The concrete arrangements are disposed as needed, which are not limited.

Compared with the prior art, advantages of the present disclosure are that the present disclosure provides a flexible OLED display assembly. By disposing a flexible connecting member, a fine repeatability of bending is achieved and the original length can be rapidly restored.

Furthermore, the bending area of the OLED panel is supported by the first support and the second support which are arranged to abut against each other, wherein upper corners of abutting end portions of the first support and the second support each is arc-shaped which aim to facilitate sliding of the OLED panel when the OLED panel is bent. The notch defined between the two abutting, arc-shaped corners enable a certain avoidance space to the OLED panel when the OLED panel is bent.

In addition, a support plate is disposed under the first support and the second support to support the first support and the second support, which aim to ensure the first support and the second support are on a same horizontal plane after the OLED is bent and to avoid the occurrence of over-bending phenomenon. Also, the support plate is capable of outwardly abutting against the flexible connecting member so that the flexible connecting member are prevented from being recessed inwards after being stretched.

Figure 1:
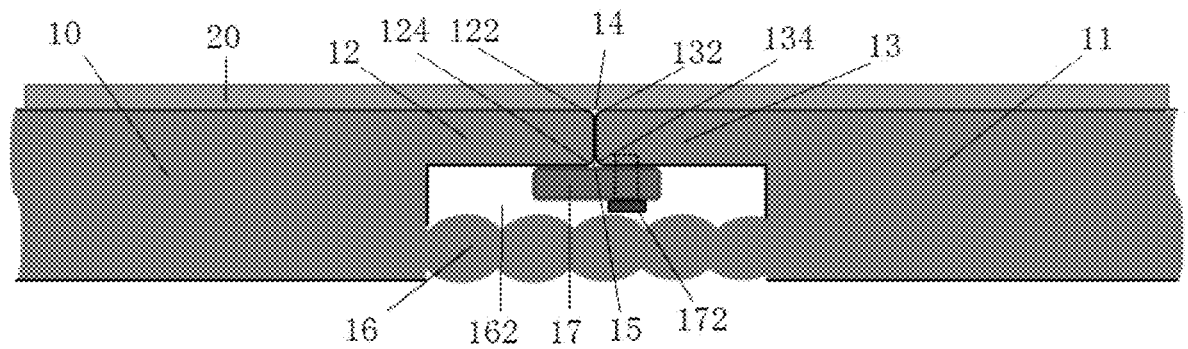
FIG. 1 is a structural schematic diagram of a flexible OLED display assembly according to an embodiment of the present invention.
Figure 2:
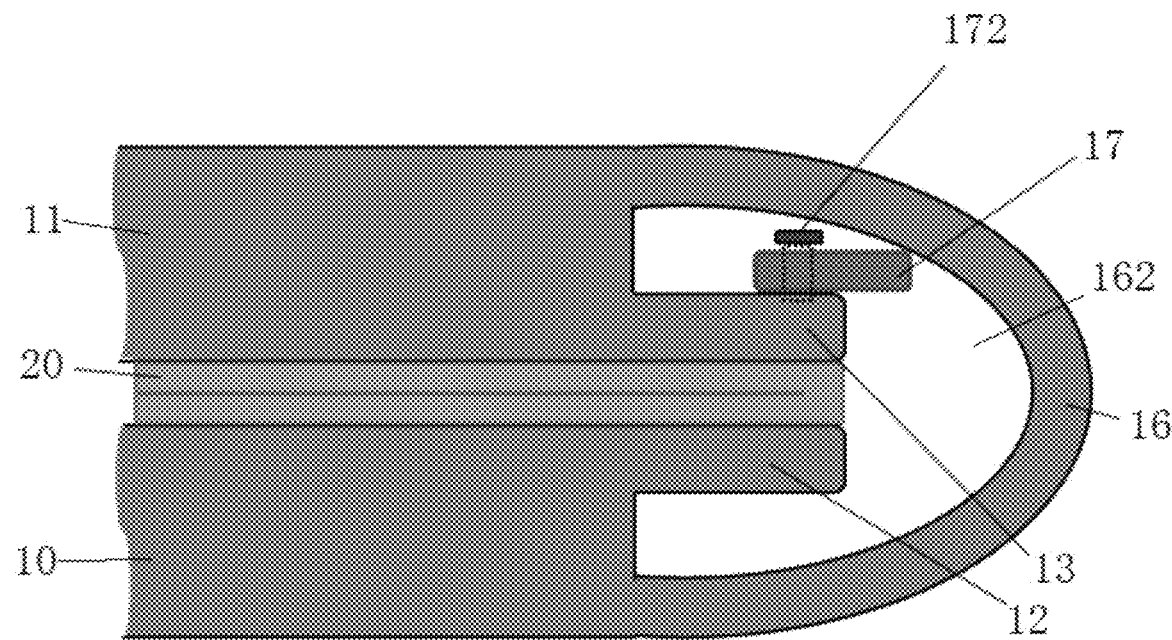
FIG. 2 is a structural schematic diagram of the flexible OLED display assembly shown in FIG. 1 in a bent state.

The reference numerals in FIGS. 1-2 are as follows:

| First substrate | 10 | Second substrate | 11 |
|---|---|---|---|
| First support | 12 | Second support | 13 |
| Upper corner | 122, 132 | Lower corner | 124, 134 |
| Upper notch | 14 | Lower notch | 15 |
| Flexible connecting member | 16 | Space | 162 |
| Support plate | 17 | Screw | 172 |
| OLED panel | 20 | | |

DETAILED DESCRIPTION OF PREFERRED EMBODIMENTS

Technical schemes of a flexible OLED display assembly which is related to the present disclosure will be further described in detail with the accompanying drawings and the specific embodiments.

Please refer to FIG. 1, an embodiment of the present invention provides a flexible OLED display assembly, comprising an OLED panel 20, wherein the OLED panel 20 has a first folding area, a folding line defined in the first folding area, and the first folding area is foldable along the folding line.

In different embodiments, the amount of the folding areas which are disposed on the OLED panel 20 can be multiple. For example, a first folding area, a second folding area, a third folding area and the like. Each folding area can be bent along a preset folding line. The concrete arrangement amount of the folding zones are disposed as needed, which are not limited. In addition, two supporting back plates are disposed in the bottom of each folding area which are disposed along the two sides of the folding line.

A first substrate 10 and a second substrate 11 are disposed under the OLED panel 20, wherein the first substrate 10 is disposed along a first side of the folding line of the first folding area and the second substrate 11 is disposed along a second side of the folding line of the first folding area. A first support 12 extends outwardly from one end of the first substrate 10, a second support 13 extends outwardly from one end of the second substrate 11, an abutting side portion of the first support 12 and an abutting side portion of the second support 13 are arranged to abut against each other and the OLED panel 20 is disposed on the first substrate 10, the first support 12, the second support 13, and the second substrate 11;

The abutting side portion of the first support 12 and the abutting side portion of the second support 13 are complementary shaped without any gaps between each other ("gapless complementary shapes"). For example, as shown in the figure, the abutting side portion of the first support 12 and the abutting side portion of the second support 13 are rectilinear shapes which form a pair of gapless complementary shapes. Correspondingly, the contact line is up-down, vertically and parallelly corresponding to the shapes of both the abutting side portion of the first support and the abutting side portion of the second support and the preset folding line of the folding area.

However, in other embodiments, gapless complementary shapes between the abutting side portion of the first support and the abutting side portion of the second support can be shaped as other types, for example, a curve shape, a sawtooth shape, and a concave-convex shape. The above gapless complementary shapes are exemplary description only. The concrete gapless complementary shapes can also be other known complementary shapes and engaging shapes. In addition, the above-mentioned gapless complementary shapes can be used in a combination, for example, a section having a curve complementary shape and a section having a sawtooth complementary shape, etc. The concrete arrangements are disposed as needed, which are not limited.

For the abutting side portion of the first support 12 and the abutting side portion of the second support 13, non-rectilinear complementary shapes are employed, for example, a curve shape, a sawtooth shape, and a concave-convex shape, etc., which also effectively prevent the displacement between both the abutting side portion of the first support and the abutting side portion of the second support and facilitate the stability of mutual positioning of both the abutting side portion of the first support and the abutting side portion of the second support. For the non-rectilinear complementary shapes of the abutting side portion of this type of support, the folding line of the folding area is up-down, vertically and parallelly corresponding to the central axis which is formed after the complementary shapes are engaged to each other.

Furthermore, upper corners 122, 132 of abutting end portions of the first support 12 and the second support 13 each is arc-shaped such that a notch 14 is defined between a supporting surface of the first support 12 and a supporting surface of the second support 13 where the end portions of the first support and the second support are arranged to abut against each other. Same design is also present in the lower corners 124, 134 of abutting end portions of the first support 12 and the second support 13 which are also shaded as are-shaped such that a lower notch 15 is also defined between the end portion of the first support and the end portion of the second support which are arranged to abut against each other.

A flexible connecting member 16 is positioned under the first support 12 and the second support 13, both ends of the flexible connecting member are respectively connected to the first substrate 10 and the second substrate 11, and a length of the flexible connecting member 16 is equal to a sum of a length of the first support 12 and a length of the second support 13 in an original normal stage of the flexible connecting member.

Furthermore, in one embodiment, the flexible connecting member 16 comprises an elastic linkage consisting of an elastic material and the flexible connecting member is stretchable and extendable when a force is applied to the flexible connecting member, wherein the elastic material can be various suitable elastic materials or springs known in the industry, as long as the resilience force thereof does not affect the bending of the OLED panel 20. The concrete selection can be determined by combining a length of the first support 12 and a length of the second support 13 and by concrete experiments.

Furthermore, in another embodiment, wherein the flexible connecting member comprises a chain-shaped stretchable structure, as shown in FIG. 1, the chain-shaped stretchable structure is stretchable and extendable when a force is applied to the chain-shaped stretchable structure, and the chain-shaped stretchable structure is retractable and returned to the original normal state by a force when the chain-shaped stretchable structure is at the extended state without generating any resilience force. Alternatively, the chain-shaped stretchable structure can also generate a certain resilience force but the resilience force does not affect the bending of the OLED panel 20.

A space 162 is defined between the flexible connecting member 16 and the first support 12, and the second support 13. The arrangement of the space 162 can prevent the present of possible accidental interference when bending the OLED panel 20 between the flexible connecting member 16 and the support.

In other different embodiments, wherein the flexible connecting member 16 can be attached to the bottom of the first support 12 and the second support 13, as long as the first support 12 and the second support 13 do not interfere with each other when the OLED panel 20 is bent. The concrete arrangements can be disposed as needed, which are not limited.

Furthermore, in the embodiment which is provided with the space 162, wherein a support plate 17 is disposed in the space 162 and the support plate 17 is attached to the bottom of the first support 12 or the second support 13 to support the first support 12 and the second support 13. The connection mode between the support plate 17 and the bottom of the support can be various connection modes known in the industry, for example, but is not limited to, screw 172 connection.

Of course, in other embodiments, the support plate may also be provided with a plurality of embodiments. For example, the support plate may comprise a first support plate and a second support plate which are disposed in a bottom of the first support and a bottom of the second support respectively, and the abutting side portion of the first support plate and the abutting side portion of the second support plate are shaped as gapless complementary shapes to each other The abutting side portion of the first support plate and the abutting side portion of the second support plate are shaped as gapless complementary shapes to each other, wherein the gapless complementary shapes each can be various known complementary shapes and engaging shapes, such as, but are not limited to, a rectilinear shape, a curve shape, a sawtooth shape, and a concave-convex shape. In addition, the above-mentioned gapless complementary shapes can be used in a combination, for example, a section having a curve complementary shape and a section having a sawtooth complementary shape, etc. The concrete arrangements are disposed as needed, which are not limited.

The shape of the two side portions of the two support plates can also be arranged with reference to the shape of the two side portions of the two supports. The structures of the two side portions of the two supports is similar to two side portions of the two support plates which are not described in details herein in order to avoid unnecessary repetition.

Please refer to FIG. 2, when the OLED panel 20 is bent, the second substrate 11 is bent upwards and the second support 13 rotates about the first support 12. Then the flexible connecting member 16 is stretched so that the flexible connecting member 16 is changed from an original normal state to an extended state.

Because the upper corners 122, 132 of abutting end portions of the first support 12 and the second support 13 each are arc-shaped which aim to facilitate sliding of the OLED panel when the OLED panel 20 is bent. The notch 14 defined between the two abutting circular arc-shaped corners 122, 132 enable a certain avoidance space to the OLED panel 20 when the OLED panel 20 is bent.

The arrangement of support plate 17 aims to ensure that the two supports 12, 13 are on a same horizontal plane after the OLED is bent and to avoid the occurrence of over-bending phenomenon. Also, the support plate 17 is capable of outwardly abutting against the flexible connecting member 16 so that the flexible connecting member 16 are prevented from being recessed inwards after being stretched.

The present disclosure relates to a flexible OLED display assembly, by disposing a flexible connecting member, a fine repeatability of bending is achieved and a disposition of a display area of the OLED panel at the bending area is avoided, thereby preventing the flexible OLED display assembly from being damaged by bending stress.

The present disclosure as claimed should not be unduly limited to such specific embodiments many modifications and variations may be made thereto to and it is intended to embrace all such modifications and variations that fall within the scope of the appended claims.

The invention claimed is:

1. A flexible organic light emitting diode (OLED) display assembly, comprising an OLED panel, wherein the OLED panel has a first folding area, a folding line defined in the first folding area, and the first folding area is foldable along the folding line, wherein the OLED display assembly comprises,
   a first substrate and a second substrate disposed under the OLED panel, wherein the first substrate disposed along a first side of the folding line of the first folding area and the second substrate are disposed along a second side of the folding line of the first folding area;
   wherein a first support extends outwardly from one end of the first substrate, a second support extends outwardly from one end of the second substrate, an abutting side portion of the first support and an abutting side portion of the second support are arranged to abut against each other and the OLED panel is disposed on the first substrate, the first support, the second support, and the second substrate;
   wherein a flexible connecting member is positioned under the first support and the second support, both ends of the flexible connecting member are respectively connected to the first substrate and the second substrate, and a length of the flexible connecting member is equal to a sum of a length of the first support and a length of the second support in an unstretched state of the flexible connecting member; and
   wherein when the first folding area of the OLED panel is folded along the folding line of the first folding area such that the second substrate covers the first substrate, the flexible connecting member being stretchable from the unstretched state to an extended state;
   wherein a space is defined between the flexible connecting member, the first support, and the second support;
   wherein a support plate is disposed in the space and the support plate is attached to the bottom of the first support and/or the second support by a screw to support the first support and the second support.

2. The flexible OLED display assembly according to claim 1, wherein upper corners of abutting side portions of the first support and the second support each is arc-shaped such that a notch is defined between a supporting surface of the first support and a supporting surface of the second support where the abutting side portions of the first support and the second support are arranged to abut against each other.

3. The flexible OLED display assembly according to claim 1, wherein the abutting side portion of the first support and the abutting side portion of the second support are shaped as gapless complementary shapes to each other.

4. The flexible OLED display assembly according to claim 3, wherein the gapless complementary shapes each is selected from the group comprising a rectilinear shape, a curve shape, a sawtooth shape, a concave-convex shape, and combinations thereof.

5. The flexible OLED display assembly according to claim 1, wherein the flexible connecting member comprises an elastic linkage consisting of an elastic material and the flexible connecting member is stretchable and extendable when a first force is applied to the flexible connecting member.

6. The flexible OLED display assembly according to claim 1, wherein the flexible connecting member comprises a chain-shaped stretchable structure, the chain-shaped stretchable structure is stretchable and extendable when a first force is applied to the chain-shaped stretchable structure, and the chain-shaped stretchable structure is retractable and returned from the extended state to the unstretched state by a second force.

7. The flexible OLED display assembly according to claim 1, wherein the support plate comprises a first support plate and a second support plate, the first support plate and the second support plate are disposed in a bottom of the first support and a bottom of the second support respectively, an abutting side portion of the first support plate and an abutting side portion of the second support plate are arranged to abut against each other, and the abutting side portion of the first support plate and the abutting side portion of the second support plate are shaped as gapless complementary shapes to each other.

8. The flexible OLED display assembly according to claim 7, wherein the gapless complementary shapes between the abutting side portion of the first support plate and the abutting side portion of the second support plate each is selected from the group a rectilinear shape, a curve shape, a sawtooth shape, a concave-convex shape, and combinations thereof.

* * * * *

UNITED STATES PATENT AND TRADEMARK OFFICE
CERTIFICATE OF CORRECTION

PATENT NO. : 10,916,717 B2
APPLICATION NO. : 16/093977
DATED : February 9, 2021
INVENTOR(S) : Yun Li Page 1 of 1

It is certified that error appears in the above-identified patent and that said Letters Patent is hereby corrected as shown below:

On the Title Page

Item [30], insert:
--May 29, 2018 (CN) 201810529634.4--

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*